(12) United States Patent
Kronenberg

(10) Patent No.: US 12,424,523 B2
(45) Date of Patent: Sep. 23, 2025

(54) LEADFRAME STRIP WITH COMPLIMENTARY UNIT DESIGN

(71) Applicant: Texas Instruments Incorporated, Dallas, TX (US)

(72) Inventor: Thomas Kronenberg, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 362 days.

(21) Appl. No.: 17/556,932

(22) Filed: Dec. 20, 2021

(65) Prior Publication Data

US 2023/0197576 A1 Jun. 22, 2023

(51) Int. Cl.
*H01L 23/495* (2006.01)
*H01L 21/48* (2006.01)
*H01L 21/56* (2006.01)

(52) U.S. Cl.
CPC .... *H01L 23/49541* (2013.01); *H01L 21/4842* (2013.01); *H01L 21/561* (2013.01); *H01L 23/49503* (2013.01)

(58) Field of Classification Search
CPC ........... H01L 23/49541; H01L 21/4842; H01L 21/561

USPC ........................................................ 438/666
See application file for complete search history.

(56) References Cited

U.S. PATENT DOCUMENTS

| 9,337,130 | B2 | 5/2016 | Lee et al. | |
| 10,199,311 | B2* | 2/2019 | Truhitte | H01L 23/49582 |
| 2014/0191381 | A1* | 7/2014 | Lee | H01L 23/49537 |
| | | | | 257/676 |
| 2019/0206768 | A1* | 7/2019 | Shibuya | H01L 23/49586 |

* cited by examiner

*Primary Examiner* — Brian Turner
(74) *Attorney, Agent, or Firm* — Ronald O. Neerings; Frank D. Cimino

(57) ABSTRACT

A leadframe strip includes a two-dimensional mechanically interconnected array of leadframe units including a plurality of leadframe unit pairs, the leadframe strip having an overall length and an overall width. The plurality of leadframe unit pairs each include a first leadframe design including a first plurality of tie bars and a plurality of first leads, and a second leadframe design that is different from the first leadframe design including a second plurality of tie bars, and a plurality of second leads. The first plurality of tie bars and the second plurality of tie bars are configured together to provide a plurality of continuous metal support networks that span an entirety of the overall length or the overall width.

22 Claims, 11 Drawing Sheets

PIN 1

LEADFRAME STRIP WITH COMPLIMENTARY UNIT DESIGN

FIELD

This Disclosure relates to leadframes for semiconductor packages.

BACKGROUND

A variety of semiconductor chip packages are known that provide support for an integrated circuit chip (IC) or die and associated bond wires, provide protection from the environment, and enable surface mounting of the die to and interconnection with a printed circuit board (PCB). One conventional package configuration includes a leadframe having a die pad and leads including wire or solder bump bond pads.

Leadframe semiconductor packages are well known and widely used in the electronics industry to house, mount, and interconnect a variety of ICs. A conventional leadframe is typically die-stamped, or chemically etched, from a sheet of flat-stock metal referred to herein as a leadframe strip arranged in a two-dimensional mechanically interconnected array of identical leadframe units each including a plurality of metal leads temporarily held together in a planar arrangement about a central region during package manufacture by a rectangular frame comprising a plurality of expendable "dam-bars." A die pad for a semiconductor die is supported in the central region by "tie-bars" that attach to the frame. The leads extend from a first end integral with the frame to an opposite second end adjacent to, but spaced apart from, the die pad.

In a flipchip on leadframe package arrangement, a semiconductor die having solder bumps on its bond pads is flipped onto a leadframe, where the die is bonded to the leads through re-flowing of the solder bumps. Flipchip assembly technology is widely utilized in semiconductor packaging due to its short interconnect paths between flipchip die and a substrate, which eliminates the space needed for wire bonding and thus reduces the overall size of the package. In addition, elimination of wire bonds reduces undesired parasitic inductance, thereby making this package configuration attractive for high-frequency applications.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize conventional leadframe strip designs are provided by repeating a 1 (single identical) unit design throughout the entire strip. Particularly for large leadframe strip sizes (meaning a large number of leadframe units, such as wherein the length of the strip is >250 mm and the width of the strip is >75 mm) the symptom of a problem recognized herein is leadframe strip deformation at the leadframe strip supplier or during handling/assembly of the leadframe strip. This problem can also manifest as what may be termed no-stick on lead or no-stick on (die) pad during wire bonding, or mold flash during molding.

Disclosed aspects instead of using a conventional leadframe strip design having a single identical unit design throughout, provide leadframe strips that repeat sets of 2 or more unique, but complementary, leadframe unit designs which are complementary because they are designed to provide mechanical support to each other and create a stronger metal support network throughout the entire leadframe strip. Disclosed leadframe strips are compatible with flipchip packages, but no-stick on lead/no-stick on pad problems are specific to a wire bond package. However, mold flash is still generally an issue for flipchip packages.

Disclosed aspects include a leadframe strip including a two-dimensional mechanically interconnected array of leadframe units including a plurality of leadframe unit pairs, the leadframe strip having an overall length and an overall width. The plurality of leadframe unit pairs each include a first leadframe design including a first plurality of tie bars and a plurality of first leads, and a second leadframe design that is different from the first leadframe design including a second plurality of tie bars and a plurality of second leads. The first plurality of tie bars and the second plurality of tie bars are configured together to provide a plurality of continuous metal support networks that span an entirety of the overall length or the overall width of a leadframe strip.

BRIEF DESCRIPTION OF THE DRAWINGS

Reference will now be made to the accompanying drawings, which are not necessarily drawn to scale, wherein:

In FIG. 5B there are shown continuous metal networks which connect between the leads, the die pad, and the tie bar supports to function to provide only mechanical support to the leadframe strip positioned on respective sides of the package saw paths shown between adjacent leadframe design units that each span an entire dimension of the leadframe strip.

DETAILED DESCRIPTION

Figure 1A:
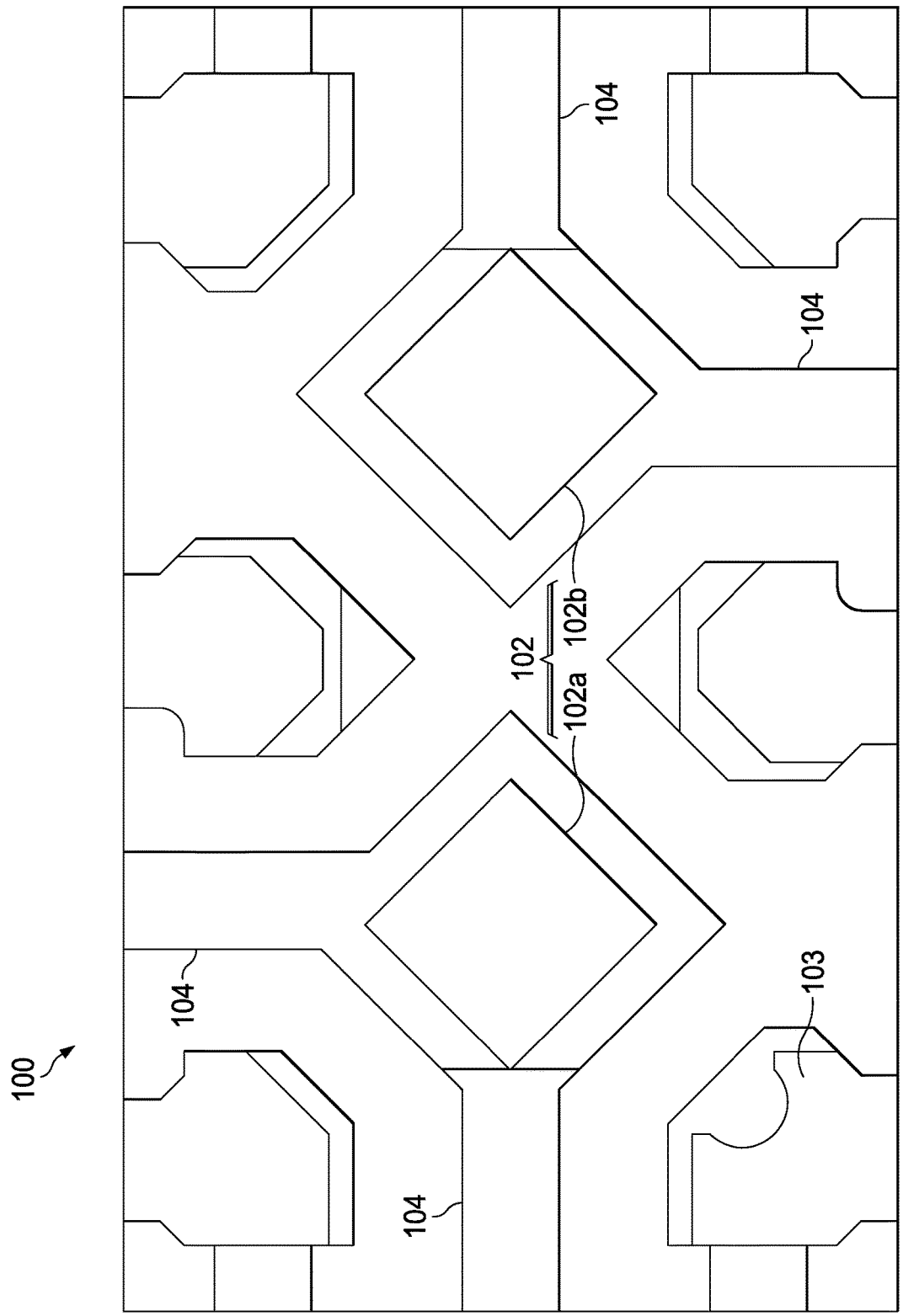
FIG. 1A is a top view of a leadframe unit and FIG. 1B shows a portion of a conventional leadframe strip having all identical leadframe units each having the same design as the leadframe unit shown in FIG. 1A, arranged in a representative array. Inter-unit scribe metal structures are omitted. The leadframe units each include a split die pad including a first die pad and a second die pad, leads, and tie bars.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 1B:
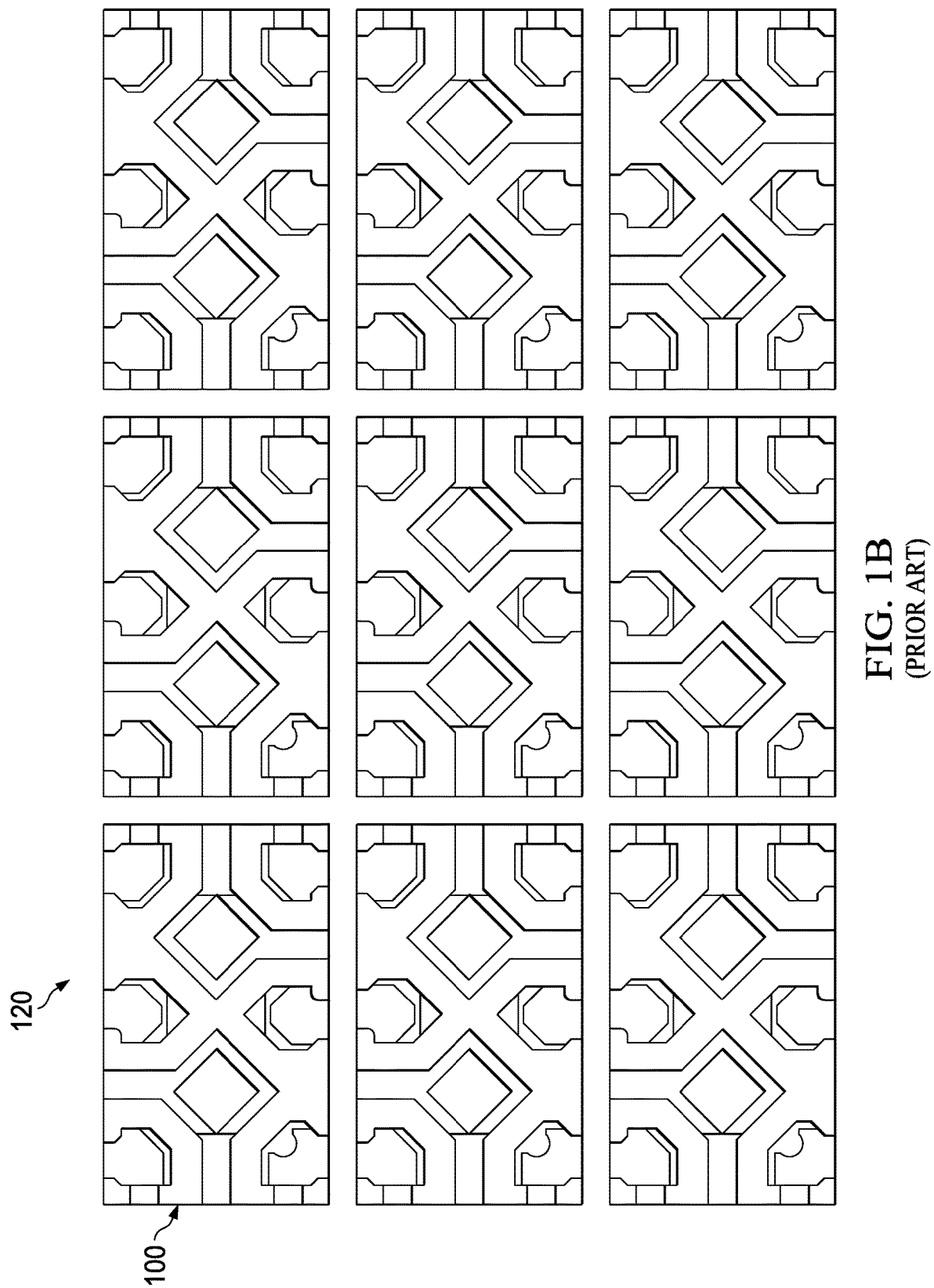

FIG. 1A is a top view of a conventional leadframe unit 100 and FIG. 1B shows a portion of a leadframe strip 120 having all identical leadframe units 100, arranged in a representative array. Inter-unit scribe metal structures are omitted in FIG. 1B. The leadframe units 100 each include a split die pad 102 including a first die pad 102a and a second die pad 102b, leads 103, and tie bars 104.

Figure 1C:
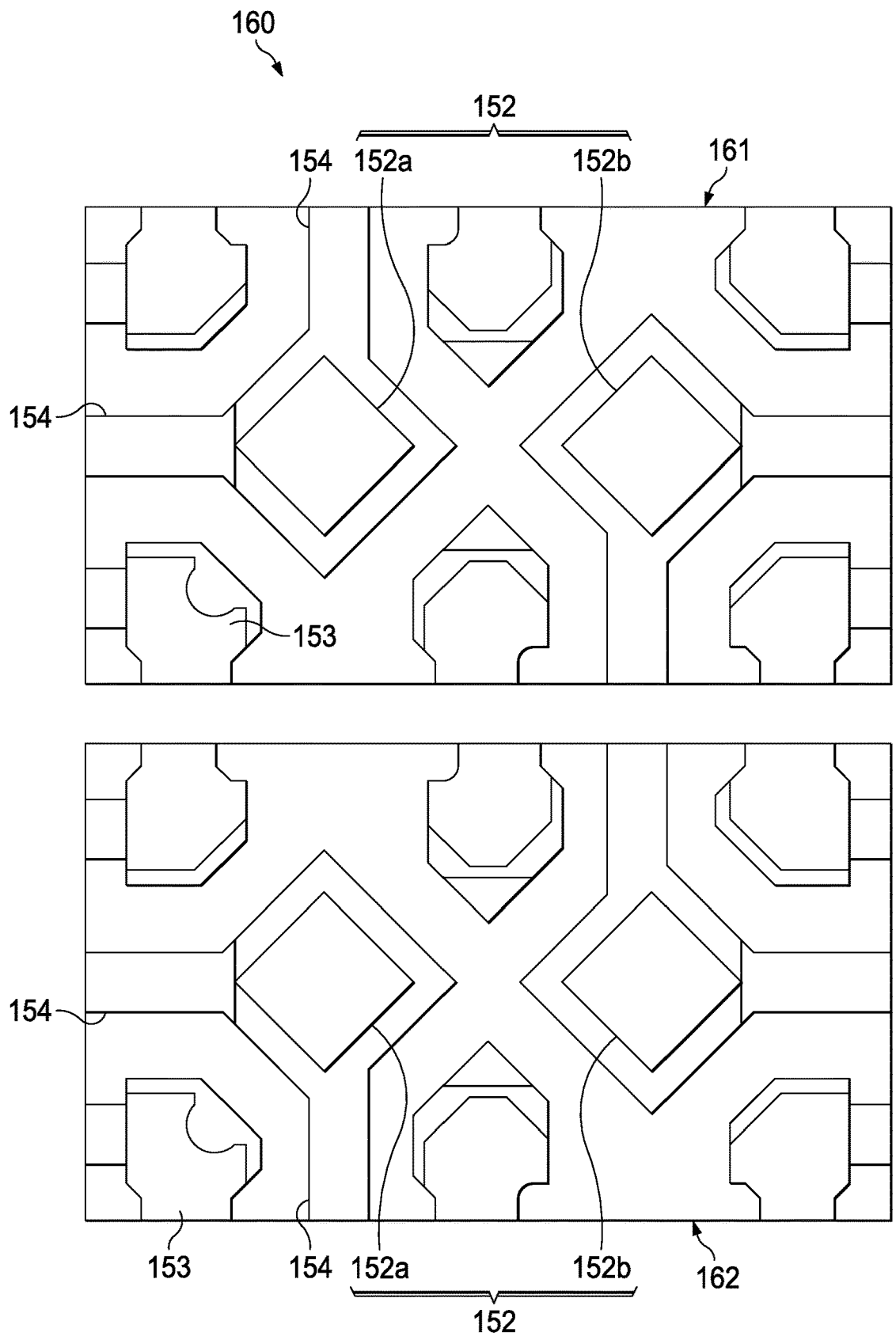
FIG. 1C is a top view of a disclosed leadframe unit pair with two leadframe units that comprises a first leadframe design unit and a second leadframe design unit that is different from the first leadframe design unit each having the same footprint as the leadframe units in the conventional leadframe strip shown in FIG. 1A.
Figure 1D:
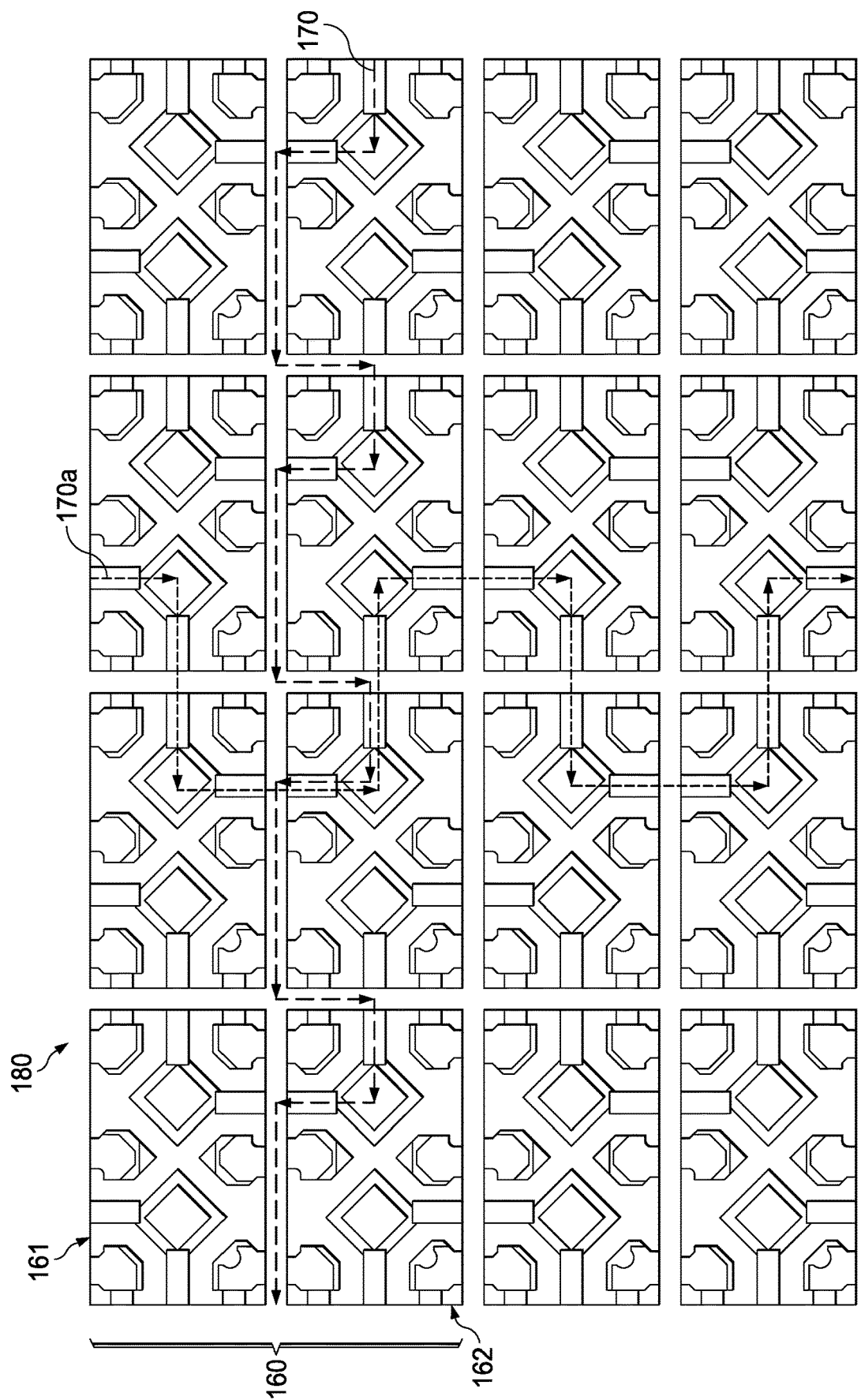
FIG. 1D shows a portion of an example leadframe strip, where there can be seen to be repeated sets of two unique, but complementary, unit designs to provide what is termed herein a unit pair that comprises a first leadframe design unit and a second leadframe design unit. There are 8 repeated sets of unit pairs shown for the leadframe strip for a total of 16 units. Also shown are the metal networks that both comprise a continuous path shown in a square wave configuration comprising a tie bar and a die pad of the split die pad of neighboring leadframe units spanning an overall width and length respectively of the leadframe strip.

FIG. 1C is a top view of an example leadframe unit pair 160 with two leadframe units that comprises a first leadframe design unit 161 and a second leadframe design unit 162 that is different from the first leadframe design unit, each having the same footprint as the leadframe unit 100 shown in FIG. 1A. The first leadframe design unit 161 has identified tie bars 154 and leads 153, and a die pad 152a and die pad 152b of a split die pad 152. FIG. 1D shows a portion of an example leadframe strip 180, having a plurality of the leadframe unit pairs 160. There are 8 repeated sets of unit pairs 160 shown for a total of 16 units. Also shown are the metal networks 170a and 170b that both comprise a continuous path shown in a square wave configuration comprising tie bars 154 and a die pad 152a or die pad 152b of the split die pad 152 of neighboring leadframe units spanning an overall width and length, respectively, of the leadframe strip 180.

The first and second leadframe design units 161, 162 in this unit pair 160 in this example are nearly mirror images. By coincidence of the unit pairs 160 of this leadframe strip 180 design many of the features in the unit pairs 160 are mirrored, but the mirror image can be seen to have been broken by the orientation of pin 1. Specifically, FIG. 1C shows that the pin 1 location remains in the bottom left corner of both the first and second leadframe design units 161, 162 of the unit pair 160, where the mouse-bite feature on the lower left lead helps identify which pin is assigned pin 1 on the end product. This feature maintains pin numbering order between the first and second leadframe design units 161, 162 of the unit pair 160. It is noted, if the first and second leadframe design units 161, 162 were only simply mirrored, the pin 1 location would be in top left of the second leadframe design units 162, and this would change all lead numbering and require a mirror version of the IC to support assembly. This feature for the unit pair 160 allows use of identical ICs on non-identical leadframe units (first and second leadframe design units 161, 162).

The continuous metal networks 170a and 170b spanning an entire dimension of the leadframe strip 180 shown in FIG. 1D is not present in the leadframe strip 120 shown FIG. 1B, where the continuous metal networks 170a and 170b enable the leadframe strip 180 to have increased mechanical robustness. This disclosed concept can be applied to leadframe strip designs where the tie bars serve no electrical purpose within the package. Instead, these tie bars serve only as mechanical support for the leadframe strip and will be seen as being electrically disconnected, vestigial structures after package singulation.

The assembly steps using disclosed leadframe strips can be all conventional steps. Existing die attach and wire bond equipment in the case of wirebond packages can be programmed to treat assembly of the complementary leadframe strip designs akin to assembly of multi-chip modules (MCMs) in an existing production line. There are no needed changes to other assembly process steps. As described above the pin 1 and orientation identifiers can remain unchanged.

Figure 2A:
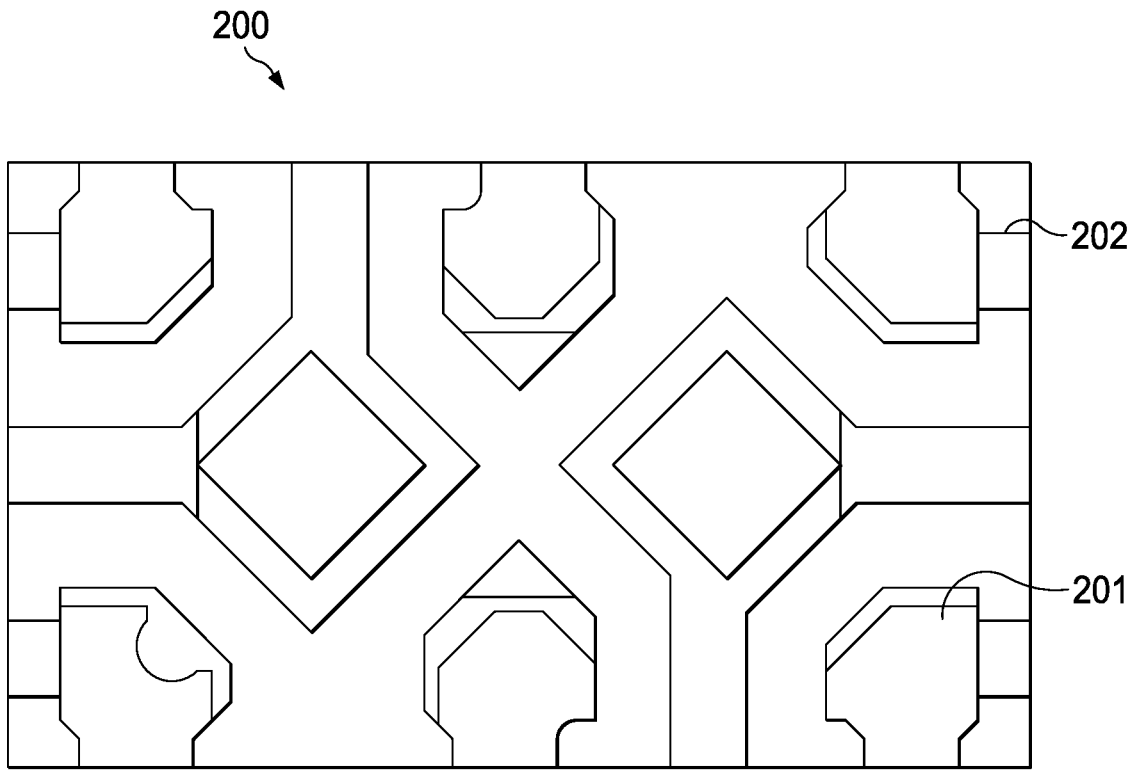
FIG. 2A shows a conventional leadframe unit including six leads each secured by a tie bar.
Figure 2B:
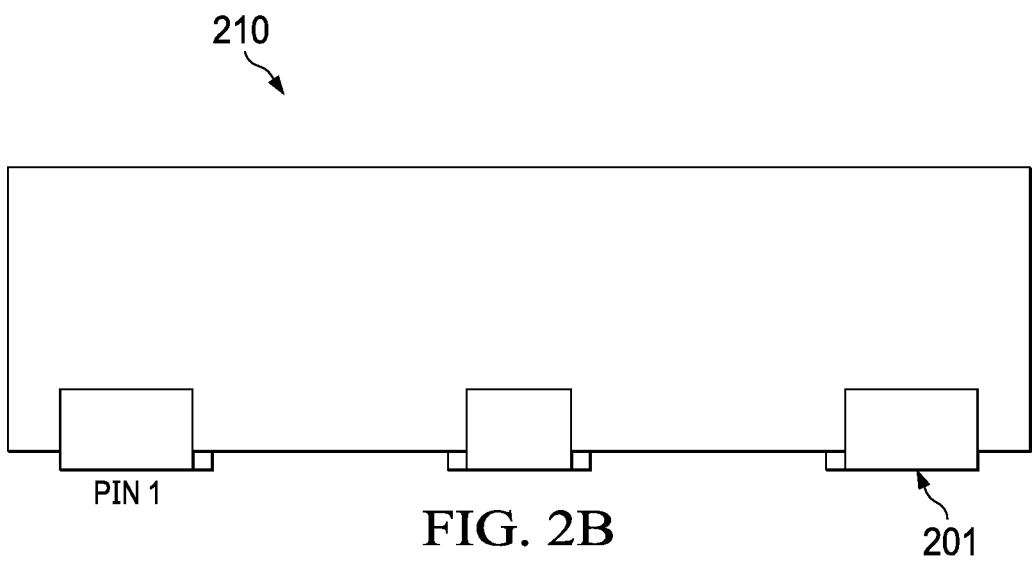
FIG. 2B shows a package side view of the leadframe unit in an assembled package showing its pin 1 location.

FIG. 2A shows a known leadframe unit 200 including six leads 201 each secured by a tie bar 202, and FIG. 2B shows a package side view of the leadframe unit 200 in an assembled package 210 showing its pin 1 location.

Figure 3A:
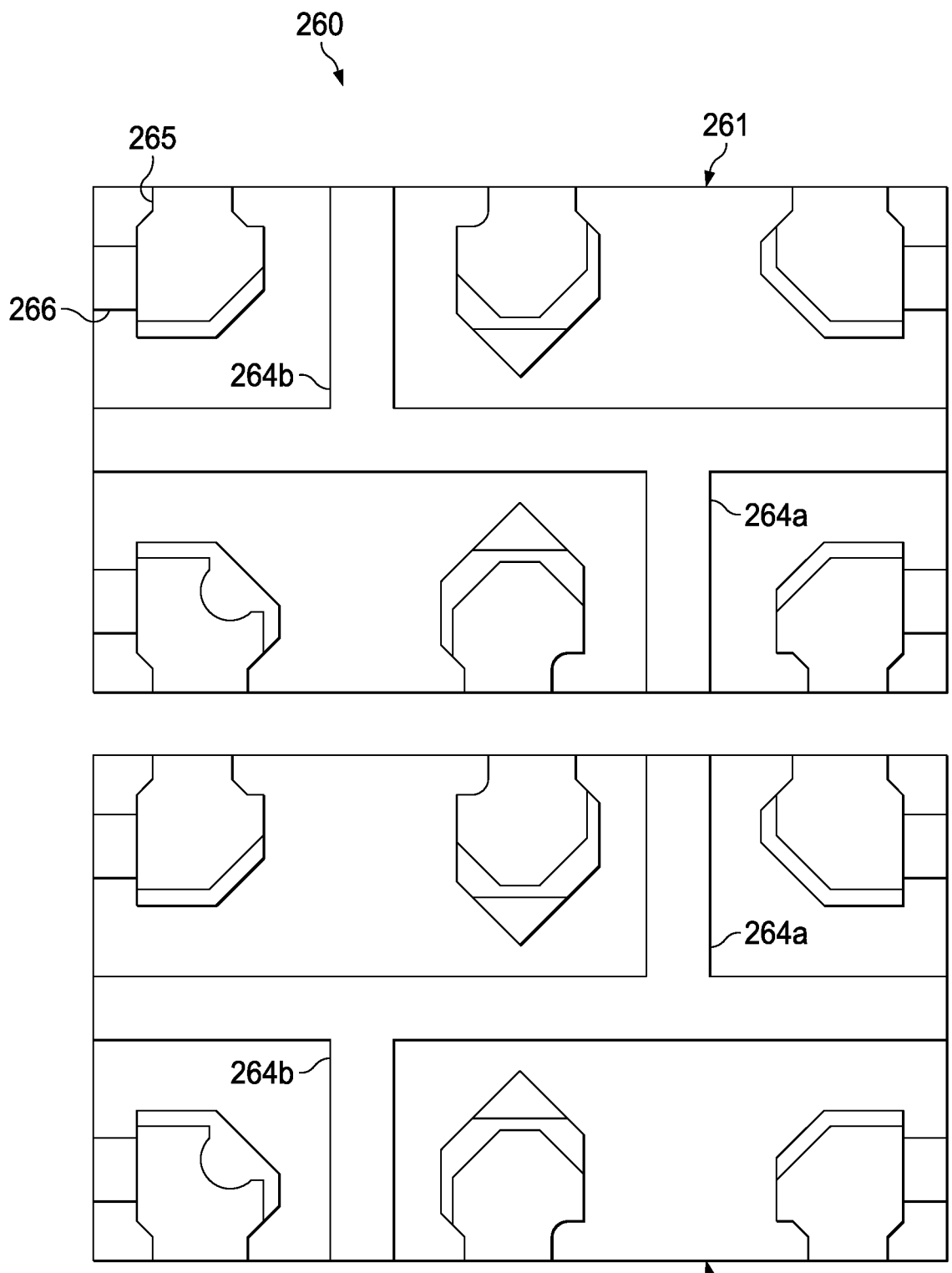
FIG. 3A shows a disclosed leadframe unit pair including a first and second leadframe design units, leads and the tie bars.
Figure 3B:
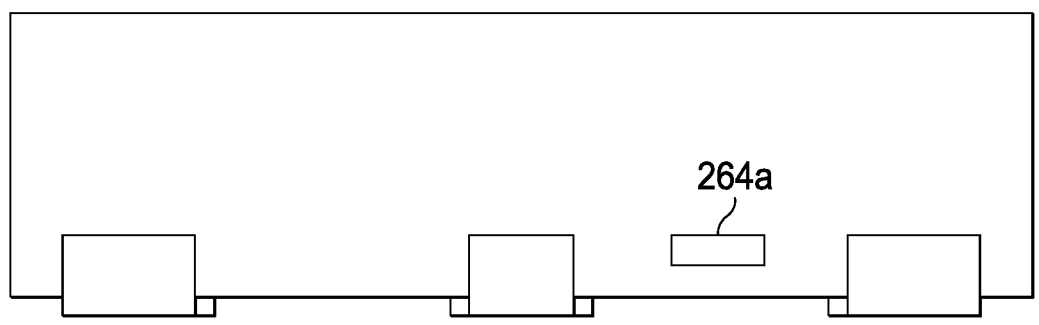
FIG. 3B and FIG. 3C show a package side view of the respective leadframe units shown in FIG. 3A, and FIG. 3B and FIG. 3C both show their common pin 1 location.
Figure 3C:
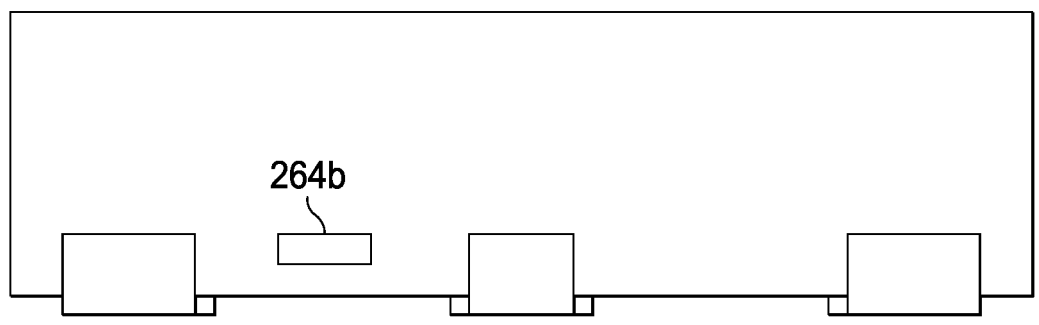

FIG. 3A shows a disclosed leadframe unit pair 260 including a first and second leadframe design units 261, 262, with the leads shown as 265 and conventional tie bars shown as 266. FIGS. 3B and 3C show a package side view of a package 270 and 280 comprising the respective leadframe units 261, 262, and its pin 1 location. The pin 1 identifier again does not change position between the respective leadframe design units 261, 262. There are also conventional tie bars 266 as well as tie bars 264a and 264b on each of the respective leadframe design units 261, 262 that are electrically isolated which provide only mechanical connections between neighboring leadframe design units 261, 262 while in strip form. The tie bars 264a and 264b for simultaneously assembled first and second leadframe design units 261, 262 are shown on the sidewall in the package side views of the respective packages 270 and 280.

Figure 4A:
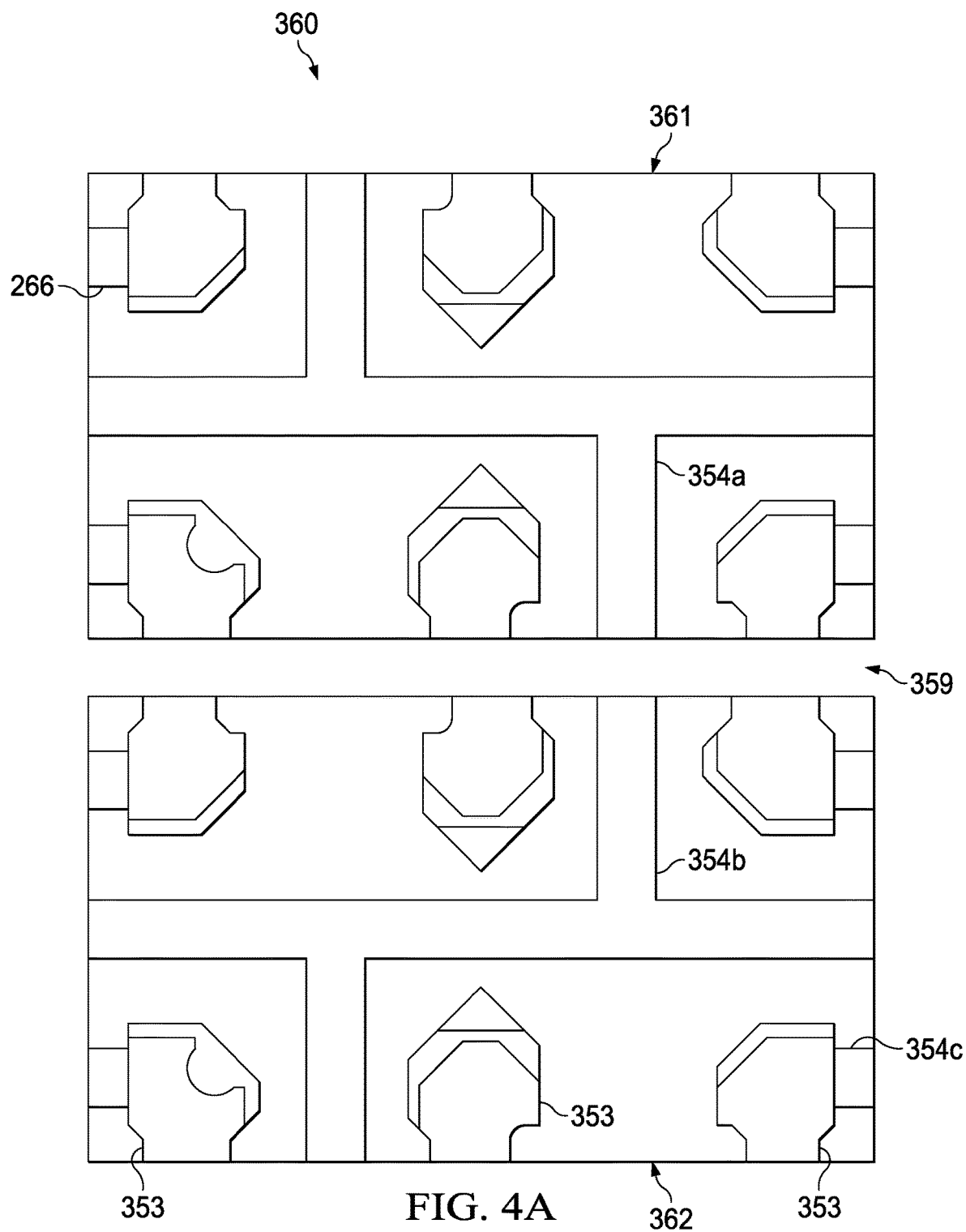
FIG. 4A shows a disclosed leadframe unit pair comprising first and second leadframe design units for flipchip packages showing solder bump land pads and tie bars. Some of the tie bars shown provide only mechanical support for neighboring leadframe design units.
Figure 4B:
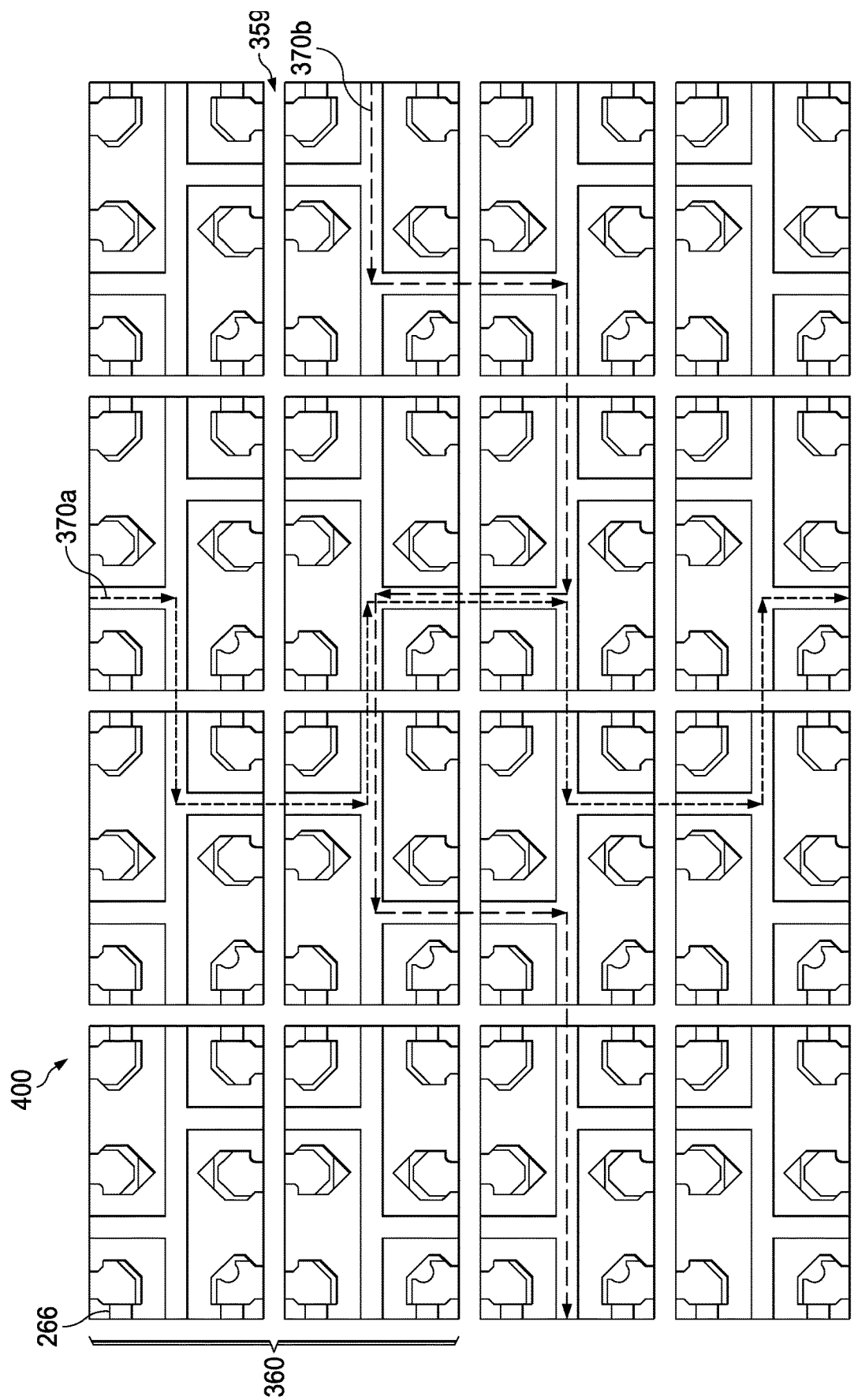
FIG. 4B shows a disclosed leadframe strip including the unit pair shown in FIG. 4A. There are shown continuous metal networks that utilize only the tie bars each spanning an entire dimension of the leadframe strip. A package saw path is shown between adjacent leadframe design units.

FIG. 4A shows a disclosed unit pair 360 comprising first and second leadframe design units 361, 362, for flipchip packages. Solder bump land pads are shown as 353, and tie bars for securing the solder bump land pads 353 are shown as 354c. the conventional tie bars are shown as 266 and there also tie bars shown as 354a and 354b which only provide support for neighboring leadframe design units. FIG. 4B shows a disclosed leadframe strip 400 including the unit pair shown 360 in FIG. 4A. For the leadframe strip 400 there are shown continuous metal networks 370a and 370b that utilize only the tie bars 354a and 354b each spanning an entire dimension of the leadframe strip 400. A package saw path 359 is shown between adjacent leadframe design units.

Figure 5A:
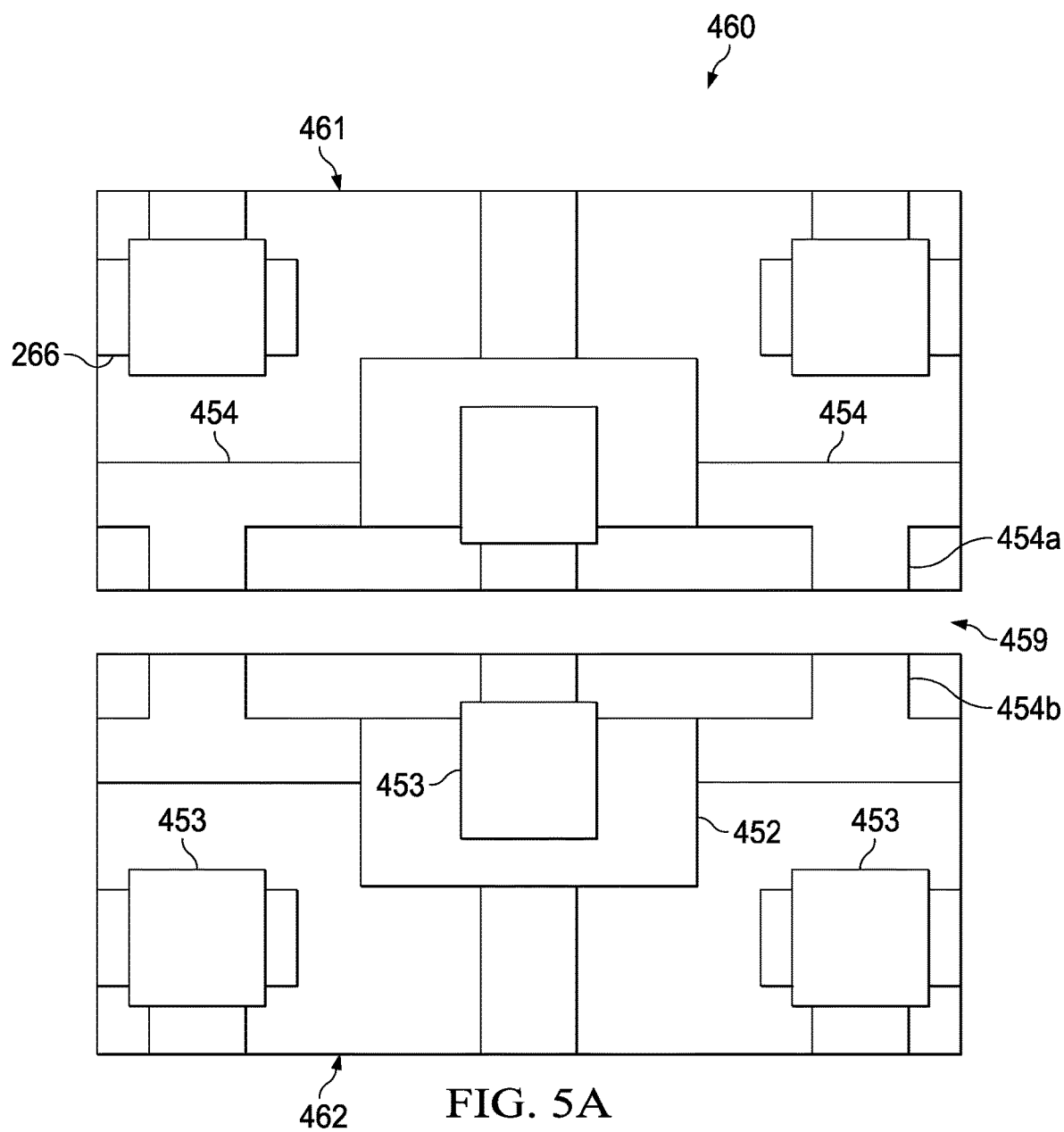
FIG. 5A shows a disclosed leadframe unit pair comprising first and second leadframe design units each having a single die pad and FIG. 5B shows a disclosed leadframe strip including a plurality of the unit pairs shown in FIG. 5B.

FIG. 5A shows a disclosed leadframe unit pair 460 comprising a first and a second leadframe design unit strip 461, 462 each having a single die pad 452 and leads shown as 453, and conventional tie bars 266 and tie bars 454a and 454b that only provide support for neighboring leadframe design units. For this leadframe design the leads 453 double as a die pad 452 where the die pad extends wider than the lead 453 which will be exposed from the mold compound. This is generally implemented by etching half the total leadframe thickness from the underside of the die pad 452 while keeping the full leadframe thickness in the region of the leads 453. As a result, after molding, only the region of the leads 453 gets exposed to the outside of the package, and the die pad 452 gets underfilled with mold to cover it up from the outside.

Figure 5B:
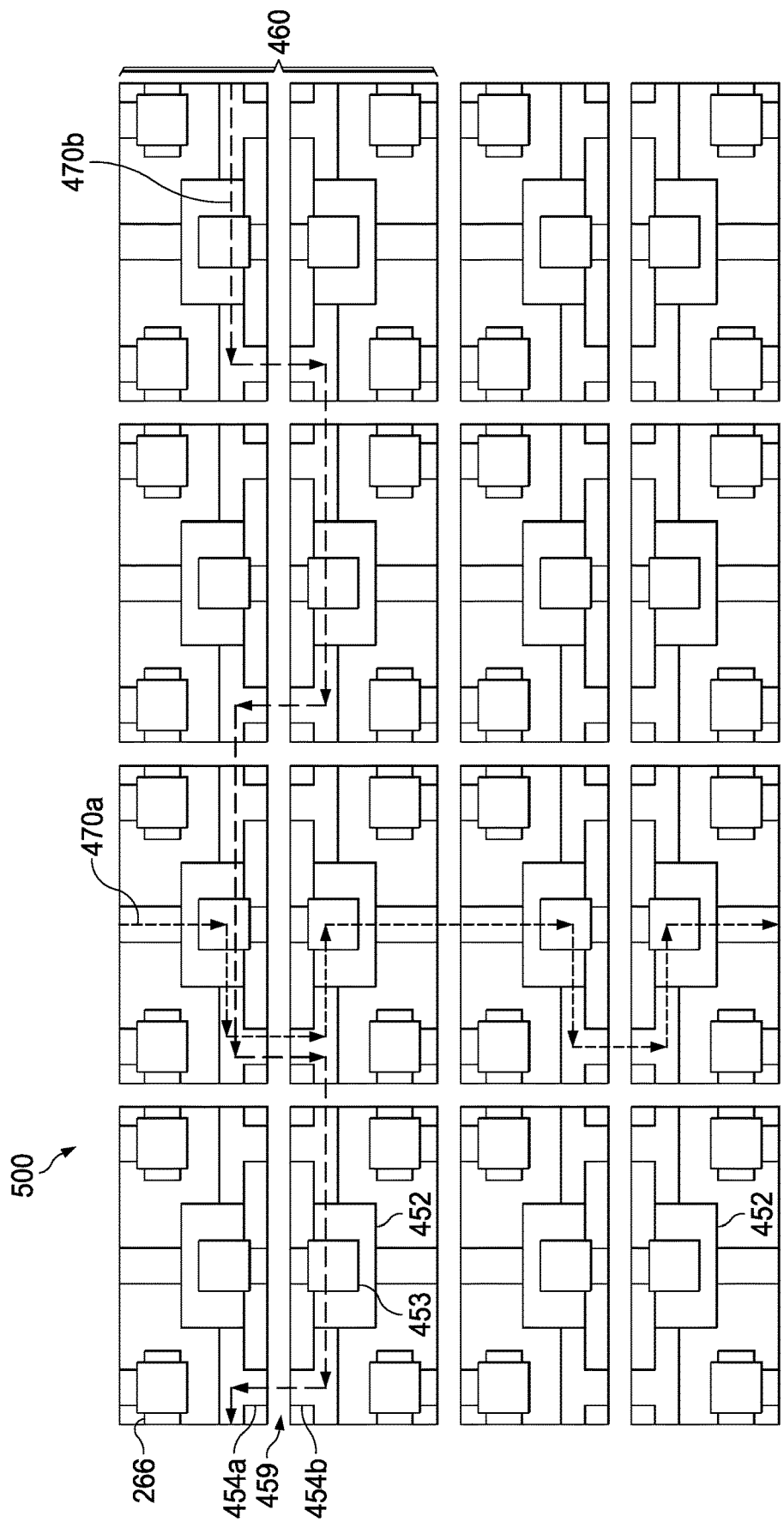

FIG. 5B shows a disclosed leadframe strip 500 including a plurality of the disclosed leadframe unit pairs 460. There are shown continuous metal networks 470a and 470b which connect between the leads 453, the die pad 452, and tie bars 454a and 454b which function to provide only mechanical support to the leadframe strip 500 positioned on respective sides of the package saw paths 459 shown between adjacent leadframe design units 461, 462 that each span an entire dimension of the leadframe strip 500.

Disclosed aspects also include a method of forming a molded semiconductor package. The method comprises providing a leadframe strip comprising a two-dimensional mechanically interconnected array of leadframe units comprising a plurality of leadframe unit pairs, the leadframe strip having an overall length and an overall width, where the plurality of leadframe unit pairs. The plurality of leadframe unit pairs each include a first leadframe design including a first plurality of tie bars and a plurality of first leads, and a second leadframe design that is different from the first leadframe design including a second plurality of tie bars and a plurality of second leads. The first plurality of tie bars and the second plurality of tie bars are configured together to provide a plurality of continuous metal support networks that span an entirety of the overall length or the overall width of the leadframe strip. An IC comprising a substrate having a semiconductor surface including circuitry electrically coupled to bond pads is mounted on each of the plurality of leadframe units. Molding encapsulates the ICs form a plurality of the molded semiconductor packages, and the leadframe strip is singulated to provide a plurality of singulated molded semiconductor packages.

For wire bond packages, disclosed aspects enable increased wire bonding optionality which can result in more space for bonding wires or fitting larger die into the same package footprint. New wire bonding locations can be added which conventionally would not be available, which can free up dimensional constraints on the maximum die size.

The location, size, and shape of all exposed leads will be consistent between complimentary units of disclosed unit pairs, and as a result, so will the printed circuit board (PCB) land pattern generally used for surface mounting. As described above, tie bar structures can be provided within the package that provide mechanical support for the strip, and need not serve electrical purpose. These can be identified as vestigial remnants from providing enhanced leadframe strip stability. The package outline drawing will be same for all units, with the exception that some units will have tie bars located in different locations than others.

Die attach (DA) and wire bond (WB) tools can be programmed to treat complementary units of disclosed unit pairs, such as analogous to the treatment for single unit multi-chip modules (MCMs), so that there is no conflict of different visual cues between neighboring (different) leadframe design units. Remaining assembly process steps such as molding and singulation can follow standard processes.

The Package Outline Drawing (POD) between units in disclosed unit pairs will generally have identical footprints so there will be no impact on customer surface mount technology (SMT) generally needed to connect the package to a PCB. The only noticeable difference will be tie bars that get exposed only on the sides of the package. The tie bar design can be intentionally added to connect to dam bars on the leadframe strip in a non-conventional way. Tie bars can serve as electrical and mechanical connections, or purely as mechanical connections to enhance strip mechanical stability. Application of this concept is described above in FIG. 2B and FIG. 3. The presence of floating or electrically isolated tie bars would appear to serve no functional electrical purpose for the final package, but as described above do serve the purpose of enhancing mechanical strip stability for manufacturing.

Disclosed aspects can be integrated into a variety of assembly flows to form a variety of different semiconductor packages and related products. The semiconductor package can comprise single IC die or multiple IC die, such as configurations comprising a plurality of stacked IC die, or laterally positioned IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A method of forming molded semiconductor packages, comprising:
   providing a leadframe strip, comprising:
      a two-dimensional mechanically interconnected array of leadframe units comprising a plurality of leadframe unit pairs, the leadframe strip having an overall length and an overall width, the plurality of leadframe unit pairs each including a first leadframe design including a first plurality of tie bars and a plurality of first leads, and a second leadframe design including a second plurality of tie bars and a plurality of second leads;
   wherein the first plurality of tie bars are provided in a mirrored orientation relative to the second plurality of tie bars in the length or width direction, such that the first and second tie bars are configured together to provide a plurality of continuous metal support networks that span an entirety of the overall length and the overall width;
   mounting an integrated circuit (IC) comprising a substrate having a semiconductor surface including circuitry electrically coupled to bond pads on each of the plurality of leadframe units, molding for encapsulating the ICs to form a plurality of the molded semiconductor packages, and singulating the leadframe strip to provide a plurality of singulated molded semiconductor packages.

2. The method of claim 1,
   wherein the first leadframe design includes at least a first die pad, and the second leadframe design includes at least a second die pad, and
   wherein the first plurality of tie bars, the second plurality of tie bars, the at least a first die pad, and the at least a second die pad are configured together to provide the plurality of continuous metal support networks.

3. The method of claim 2, wherein the at least the first die pad and the at least the second die pad are both split die pads.

4. The method of claim 1, wherein the plurality of continuous metal support networks are each square wave shaped.

5. The method of claim 1, wherein the first leadframe design and the second leadframe design are mirror images of one another except for a location of a reference pin.

6. The method of claim 1, wherein some of the first plurality of tie bars and some of the second plurality of tie bars are electrically floating.

7. The method of claim 1, wherein the first leadframe design and the second leadframe design are exclusive of any die pad.

8. The method of claim 1, wherein the plurality of continuous metal support networks collectively span an entirety of the overall length and the overall width.

9. The method of claim 1, wherein the length is >250 mm and the width is >75 mm.

10. The method of claim 1, wherein the first leadframe design and the second leadframe design have identical exposed portions of the first leads and the second leads and also identical surface mount footprints.

11. A method of forming molded semiconductor packages, comprising:
providing a leadframe strip, comprising:
a two-dimensional mechanically interconnected array of leadframe units comprising a plurality of leadframe unit pairs each including a first leadframe design including a first plurality of tie bars and a plurality of first leads, and a second leadframe design including a second plurality of tie bars and a plurality of second leads;
wherein the first plurality of tie bars are provided in a mirrored orientation relative to the second plurality of tie bars in the length or width direction, such that the first and second tie bars are configured together to provide a plurality of continuous metal support networks that span an entirety of an overall length and an overall width of the leadframe strip; and
mounting an integrated circuit (IC) comprising a substrate having a semiconductor surface including circuitry electrically coupled to bond pads on each of the plurality of leadframe units.

12. The method of claim 11, further including covering the ICs with molding material to form a plurality of the molded semiconductor packages.

13. The method of claim 12, further including singulating the leadframe strip to provide a plurality of singulated molded semiconductor packages.

14. The method of claim 11, further including singulating the leadframe strip to provide a plurality of singulated semiconductor packages.

15. The method of claim 11,
wherein the first leadframe design includes at least a first die pad, and the second leadframe design includes at least a second die pad, and
wherein the first plurality of tie bars, the second plurality of tie bars, the at least a first die pad, and the at least a second die pad are configured together to provide the plurality of continuous metal support networks.

16. The method of claim 15, wherein the at least the first die pad and the at least the second die pad are both split die pads.

17. The method of claim 11, wherein the plurality of continuous metal support networks are each square wave shaped.

18. The method of claim 11, wherein the first leadframe design and the second leadframe design are mirror images of one another except for a location of a reference pin.

19. The method of claim 11, wherein some of the first plurality of tie bars and some of the second plurality of tie bars are electrically floating.

20. The method of claim 11, wherein the overall length is >250 mm and the overall width is >75 mm.

21. The method of claim 11, wherein the first leadframe design and the second leadframe design have identical exposed portions of the first leads and the second leads and also identical surface mount footprints.

22. A method of forming a molded semiconductor package, comprising:
providing a two-dimensional mechanically interconnected leadframe unit comprising a leadframe unit pair, the leadframe unit pair including a first leadframe design including a first plurality of tie bars and a plurality of first leads, and a second leadframe design including a second plurality of tie bars and a plurality of second leads;
wherein the first plurality of tie bars are provided in a mirrored orientation relative to the second plurality of tie bars in the length or width direction, such that the first and second tie bars are configured together to provide a plurality of continuous metal support networks that span an entirety of an overall length and an overall width of the leadframe strip;
mounting an integrated circuit (IC) comprising a substrate having a semiconductor surface including circuitry electrically coupled to bond pads on each of the leadframe units; and
molding for encapsulating the ICs to form a molded semiconductor packages.

* * * * *